(12) United States Patent
Kong et al.

(10) Patent No.: US 9,226,077 B2
(45) Date of Patent: Dec. 29, 2015

(54) ACOUSTIC ACTUATOR AND ACOUSTIC ACTUATOR SYSTEM

(75) Inventors: Cha-Sik Kong, Gyeonggi-do (KR); Yun-Jong Baik, Gyeonggi-do (KR)

(73) Assignee: AR Spacer Co., Ltd. (KR)

( * ) Notice: Subject to any disclaimer, the term of this patent is extended or adjusted under 35 U.S.C. 154(b) by 96 days.

(21) Appl. No.: 13/996,799

(22) PCT Filed: Dec. 23, 2011

(86) PCT No.: PCT/KR2011/100061
§ 371 (c)(1),
(2), (4) Date: Jun. 21, 2013

(87) PCT Pub. No.: WO2012/087074
PCT Pub. Date: Jun. 28, 2012

(65) Prior Publication Data
US 2013/0287233 A1    Oct. 31, 2013

(30) Foreign Application Priority Data
Dec. 23, 2010    (KR) .................. 10-2010-0133890

(51) Int. Cl.
*H04R 17/00*    (2006.01)
*H04R 7/04*    (2006.01)

(52) U.S. Cl.
CPC ............... *H04R 17/00* (2013.01); *H04R 7/045* (2013.01)

(58) Field of Classification Search
CPC ..... H04R 17/00; H04R 17/10; H04R 2217/01
USPC .................... 381/150, 190–191, 116; 367/180
See application file for complete search history.

(56) References Cited

U.S. PATENT DOCUMENTS

| | | | | |
|---|---|---|---|---|
| 4,593,160 | A * | 6/1986 | Nakamura | 381/163 |
| 6,453,050 | B1 * | 9/2002 | Ogura et al. | 381/190 |
| 2004/0081326 | A1 * | 4/2004 | Michiels | 381/190 |
| 2008/0218031 | A1 * | 9/2008 | Kuroda et al. | 310/334 |
| 2010/0290650 | A1 * | 11/2010 | Ogura et al. | 381/190 |
| 2011/0007713 | A1 | 1/2011 | Kobayashi | |

FOREIGN PATENT DOCUMENTS

| | | | |
|---|---|---|---|
| CN | 1512481 A | 7/2004 | |
| CN | 101313628 A | 11/2008 | |
| JP | 2002135893 | 5/2002 | |
| JP | 2008125005 | 5/2008 | |
| KR | 1020080102656 A | 11/2008 | |
| WO | 2008143463 A2 | 11/2008 | |
| WO | WO 2008/143463 | * 11/2008 | ............ H04R 17/00 |
| WO | 2009098853 A1 | 8/2009 | |
| WO | 2009098859 A1 | 8/2009 | |
| WO | 2010137242 A1 | 12/2010 | |

OTHER PUBLICATIONS

International Search Report for Application No. PCT/KR2011/010061 dated May 14, 2012.

* cited by examiner

*Primary Examiner* — Ahmad F Matar
*Assistant Examiner* — Sabrina Diaz
(74) *Attorney, Agent, or Firm* — Lerner, David, Littenberg, Krumholz & Mentlik, LLP

(57) ABSTRACT

An acoustic actuator according to an exemplary embodiment of the present invention includes: an actuator element generating a corresponding sound in response to an applied electrical signal; a supporting member supporting the actuator element so as to form a movement axis of the actuator element; and an edge member connected with the actuator element. The actuator element includes: a piezoelectric unit having at least one piezoelectric member of which a length is larger than a width by at least $\sqrt{2}$ times; and a membrane unit including at least one membrane member generating the corresponding sound in response to the applied electrical signal, by being fixedly adhered to the piezoelectric unit so as to extend in a length direction of the at least one piezoelectric member and by forming wave movement in the extending direction in response to a current applied to the piezoelectric unit.

16 Claims, 19 Drawing Sheets

(a)

(b)

(a) Node support $$f_0 = \frac{0.412 \cdot t}{r^2} \sqrt{\frac{E}{\rho(1-\delta^2)}}$$

(b) Edge support $$f_0 = \frac{0.233 \cdot t}{r^2} \sqrt{\frac{E}{\rho(1-\delta^2)}}$$

(c) Central support $$f_0 = \frac{0.172 \cdot t}{r^2} \sqrt{\frac{E}{\rho(1-\delta^2)}}$$

$f_0$: resonance frequency  
t: thickness  
r: radius of metal plate  
E: Young's modulus  
$\rho$: density  
$\delta$: Poisson's ratio

FIG. 19

| | configuration | resonance frequency | resonance constant |
|---|---|---|---|
| node support | | $f_0 = \dfrac{0.412 \cdot t}{r^2} \sqrt{\dfrac{E}{\rho(1-\sigma^2)}}$ | 0.412 |
| edge support | | $f_0 = \dfrac{0.233 \cdot t}{r^2} \sqrt{\dfrac{E}{\rho(1-\sigma^2)}}$ | 0.233 |
| central support | | $f_0 = \dfrac{0.172 \cdot t}{r^2} \sqrt{\dfrac{E}{\rho(1-\sigma^2)}}$ | 0.172 |
| single cantilever | | $f_0 = \dfrac{0.040 \times t}{r^2} \sqrt{\dfrac{E}{\rho(1-\sigma^2)}}$ | 0.040 |

ACOUSTIC ACTUATOR AND ACOUSTIC ACTUATOR SYSTEM

CROSS REFERENCE TO RELATED APPLICATIONS

The present application is a national phase entry under 35 U.S.C. §371 of International Application No. PCT/KR2011/010061 filed Dec. 23, 2011, published in Korean, which claims priority from Korean Patent Application No. 10-2010-0133890 filed Dec. 23, 2010, all of which are hereby incorporated herein by reference.

TECHNICAL FIELD

The present invention relates to an acoustic actuator utilizing an actuator element in which a piezoelectric unit is conjoined with a membrane unit. More particularly, the present invention relates to an acoustic actuator having an actuator element, a supporting member, and an edge member, where the actuator element performs a wave movement so that a sound may be generated in a wide frequency range.

BACKGROUND ART

Generally, a sound is a wave propagated in a medium, and is called a sound wave, which is a vibration propagated in the medium. Animals as well as human beings, having an auditory organ, may detect a sound. However, audible frequency ranges of animals and human beings differ, depending on species. An audio frequency, which is a frequency range of audible sound of human beings, is known to be 20 Hz-20,000 Hz.

A typical speaker generates a sound by reciprocally moving a vibration membrane that is called a cone, that is, by moving a vibration membrane back and forth. Taking an example of a woofer that generates a low tone sound, air in front of the vibration membrane is compressed when the vibration membrane moves forward, and air pressure in front of the vibration membrane is lowered by becoming sparse when the vibration membrane moves rearward. That is, when the vibration membrane moves forward, a positive ("+") sound pressure level occurs in front of the vibration membrane, and when the vibration membrane moves rearward, a negative ("−") sound pressure level occurs in front of the vibration membrane. A wave occurs by such an operation, and ears of human beings can detect the wave as sound when the frequency of the wave is between 20 Hz and 20,000 Hz.

Generally, an acoustic actuator denotes a speaker or a receiver, among which research is carried out on piezoelectric speakers, for application to portable electronic devices such as a portable terminal and PDA since they are thin and light-weighted in comparison with a conventional VCM (Voice Coil Motor) speaker. A piezoelectric speaker is also called a piezoelectric buzzer, which utilizes a converse piezoelectric effect of a piezoelectric device.

A conventional piezoelectric speaker is formed by attaching a piezoelectric device on a circular vibration membrane made of metal such as brass, stainless steel, a nickel alloy, etc.

A technique for realizing a larger sound pressure level using Helmholtz's resonance principle has been proposed, however, such a technique has been found impractical since an overall exterior diameter of a speaker should be excessively large in order to realize a low frequency of merely about 100 Hz.

As a conventional scheme, an edge of the circular piezoelectric device is fixed, and a hollow space for a resonance is formed in the central area. Such a scheme could amplify only specific frequencies, and did not how a good characteristic at a low frequency or in a wide frequency range. That is, flatness over an entire frequency bandwidth is low, and this means that a sound of a specific frequency may be reproduced but a sound of other frequencies may not be sufficiently reproduced. That means that a sound source having various frequencies may not be reproduced. Thus, such a scheme is used only for a buzzer.

Furthermore, according to the conventional art, the sound pressure level was not high, and thus the resulting sound was too small for a use as an audio speaker.

In an attempt to improve a low frequency characteristic, using a piezoelectric device as a vibration source, a generated vibration is transferred to a panel using a supporting member. However, such a scheme has been found to have drawbacks that a separate panel must be designed, and since the panel is connected with some other component, the vibration is disturbed or the vibration deteriorates electrical or mechanical characteristics of another component.

DISCLOSURE

Technical Problem

The present invention, made in an effort to overcome the above drawbacks, attempts to simultaneously improve a low frequency acoustic characteristic, improve flatness over a frequency bandwidth, and improve a sound pressure level. In addition, it attempts to minimize constituent elements required to realize sufficient sound pressure level. In addition, it attempts to realize down-sizing by achieving a thin thickness.

Technical Solution

An acoustic actuator according to an exemplary embodiment of the present invention includes: an actuator element generating a corresponding sound in response to an applied electrical signal; a supporting member supporting the actuator element so as to form a movement axis of the actuator element; and an edge member connected with the actuator element.

The actuator element includes: a piezoelectric unit having at least one piezoelectric member of which a length is larger than a width by at least $\sqrt{2}$ times; and a membrane unit including at least one membrane member generating the corresponding sound in response to the applied electrical signal, by being fixedly adhered to the piezoelectric unit so as to extend in a length direction of the at least one piezoelectric member and by forming wave movement in the extending direction in response to a current applied to the piezoelectric unit.

The piezoelectric unit may include a plurality of piezoelectric members disposed in parallel in their width direction on a same plane.

The membrane unit may further include a driven member amplifying the wave movement of the membrane member by being adhered to the membrane member such that the membrane unit extends in a length direction of the membrane member.

The supporting member may be formed at a location that asymmetrically divides the actuator element.

The supporting member may be coupled with the membrane unit, and the piezoelectric unit may be formed distal to the supporting member along a length direction of the piezoelectric unit.

The membrane unit may include a same number of membrane members as the plurality of piezoelectric members, and the piezoelectric members may be respectively adhered to the membrane members.

In this case, the membrane unit may further include a driven member amplifying the wave movement of the plurality of membrane members by interconnecting ends of the plurality of membrane members such that the membrane unit extends in a length direction of the plurality of membrane members.

The piezoelectric unit may be adhered to upper and lower sides of the membrane unit.

An acoustic actuator according to an exemplary embodiment of the present invention system may further include an elastic member interposed between the actuator element and the supporting member so as to allow surface vibration of the actuator element.

An acoustic actuator system according to an exemplary embodiment of the present invention may include: a first acoustic actuator according to such an exemplary embodiment of the present invention; a second acoustic actuator according to such an exemplary embodiment of the present invention; and a piezoelectric unit driver driving the first and second acoustic actuators at the same time.

Each of the first and second acoustic actuators may be asymmetrical with respect to respective supporting members.

The first acoustic actuator and the second acoustic actuator may have different dimensions, and each of the first and second acoustic actuators may be symmetrical with respect to respective supporting members.

The first acoustic actuator and the second acoustic actuator may have different dimensions, the first acoustic actuator may be symmetrical with respect to its supporting member, and the second acoustic actuator may be asymmetrical with respect to its supporting member.

The first acoustic actuator may be a single cantilever type, and the second acoustic actuator may be a double cantilever type.

Advantageous Effects

According to an exemplary embodiment of the present invention, a low frequency sound may be realized in a small actuator by forming a piezoelectric member to be lengthy and designing an actuator element along the length direction of the piezoelectric member. In addition, a sound pressure level may be improved by elongating the membrane member in a length direction of the piezoelectric member. Therefore, an excellent sound pressure level may be obtained without employing an additional resonance apparatus.

Furthermore, an additional panel is not required to be connected to an actuator element (a so-called a piezoelectric device), since the membrane unit itself enables low frequency sound and amplification of the sound pressure level. Therefore, the structure may be simplified, and thus productivity may be increased.

In addition, since employed constituent elements such as the piezoelectric member and the membrane member are formed planar on the same plane, a height of the acoustic actuator may be decreased in comparison with the conventional scheme where they are three-dimensionally combined.

By using a plurality of piezoelectric members, the sound pressure level may be further increased, and furthermore, productivity and/or production cost are improved since a greater number of employed piezoelectric members may be simply employed for larger membrane member.

When a driven member is attached such that the membrane unit may extend in the direction of the membrane member, wave movement of the membrane member may be amplified, and thereby the sound pressure level may be improved.

Flatness of sound may be improved by disposing the supporting member at a location that asymmetrically divides the actuator element.

DESCRIPTION OF THE DRAWINGS

FIG. 19 is a chart relating to the calculation of the resonance frequency of an actuator element according to an exemplary embodiment of the present invention.

MODE FOR INVENTION

Exemplary embodiments of the present invention are hereinafter described in detail with reference to accompanying drawings. The exemplary embodiments are merely exemplary, and the scope of the present invention should not be understood to be limited thereto since various variations may be introduced by a person of ordinary skill in the art.

Figure 8:
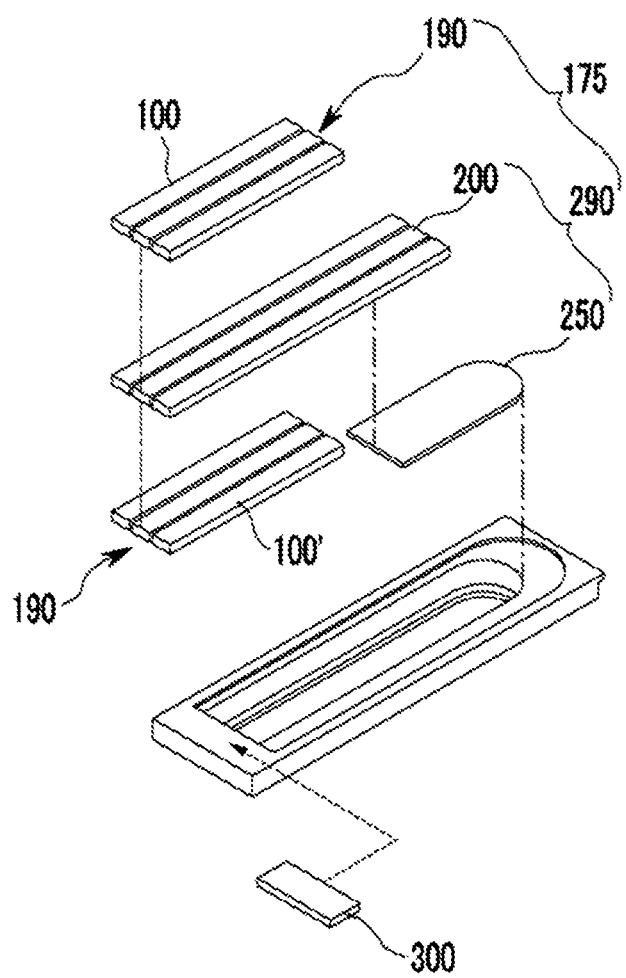
FIG. 8 is an exploded perspective view showing a single cantilever type acoustic actuator according to an exemplary embodiment of the present invention.
Figure 9:
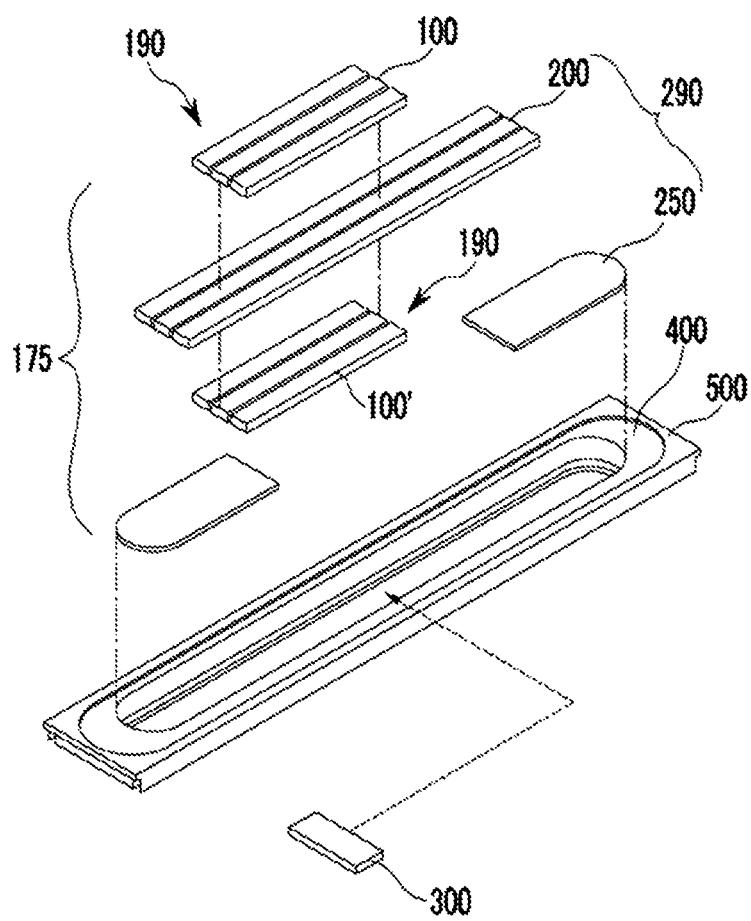
FIG. 9 is an exploded perspective view showing a double cantilever type acoustic actuator according to an exemplary embodiment of the present invention.

FIG. 8 and FIG. 9 are perspective views showing acoustic actuators according to exemplary embodiments of the present invention, wherein FIG. 8 is a perspective view showing a single cantilever type acoustic actuator according to an exemplary embodiment of the present invention, and FIG. 9 is perspective view showing a double cantilever type acoustic actuator according to an exemplary embodiment of the present invention.

As shown in FIG. 8 and FIG. 9, an acoustic actuator according to an exemplary embodiment of the present invention includes: an actuator element 175 generating a corresponding sound in response to an applied electrical signal; a supporting member 300 supporting the actuator element 175 so as to form a movement axis of the actuator element 175; and an edge member 400 connected with the actuator element 175. The edge member 400 interconnects the actuator element 175 and a frame member 500.

The actuator element 175 includes a piezoelectric unit 190 and a membrane unit 290. The piezoelectric unit 190 includes at least one piezoelectric member 100, of which a length is larger than a width by at least $\sqrt{2}$ times.

The membrane unit 290 includes at least one membrane member 200 generating the corresponding sound in response to the applied electrical signal, by being fixedly adhered to the piezoelectric unit 190 so as to extend in a length direction of the at least one piezoelectric member 100 and by forming a wave movement in the extending direction in response to a current applied to the piezoelectric unit 190.

Although the supporting member 300 is illustrated as a single member formed in a width direction of the actuator element 175 in FIG. 8 and FIG. 9, it should be understood that the scope of the present invention is not limited thereto. Numerous variations may be employed thereto, which will be described later in detail.

As shown in FIG. 8 and FIG. 9, according to an acoustic actuator according to an exemplary embodiment of the present invention, the membrane unit 290 may further include a driven member 250 amplifying the wave movement of the membrane member 200 by being adhered to the membrane member 200 such that the membrane unit 290 extends in a length direction of the membrane member 200. When the membrane unit 290 includes a plurality of membrane members 200, the driven member 250 may interconnect ends of the plurality of membrane members 200 such that the plurality of membrane members 200 may integrally operate.

In FIG. 8 and FIG. 9, it is illustrated that the piezoelectric unit 190 according to an exemplary embodiment of the present invention includes a plurality of piezoelectric members 100 and the membrane unit 290 according to an exemplary embodiment of the present invention includes a plurality of membrane members 200. However, it should be understood that the scope of the present invention is not limited thereto. Depending on embodiments, the piezoelectric unit 190 may include a single piezoelectric member 100, and also, depending on embodiments, the membrane unit 290 may include a single membrane member 200.

Hereinafter, a basic scheme of the actuator element 175 according to an exemplary embodiment of the present invention is described with reference to FIG. 1 and FIG. 2.

Figure 1:
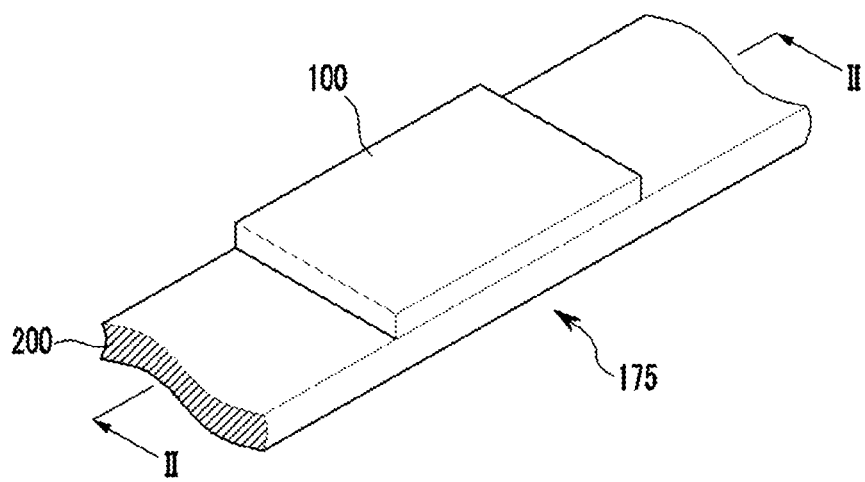
FIG. 1 is a perspective view showing an actuator element according to an exemplary embodiment of the present invention.
Figure 2:
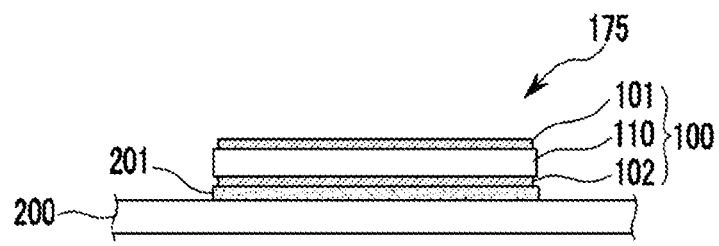
FIG. 2 is a cross-sectional view of FIG. 1 according to a line II-II.

FIG. 1 is a perspective view showing the actuator element 175 according to an exemplary embodiment of the present invention, and FIG. 2 is a cross-sectional view of FIG. 1 according to a line II-II.

As shown in FIG. 1, in the actuator element 175 according to an exemplary embodiment of the present invention, the piezoelectric member 100 and the membrane member 200 are adhered to each other. When the piezoelectric unit 190 is formed as a single piezoelectric member, the piezoelectric member 100 may be the single piezoelectric member, and when the piezoelectric unit 190 includes a plurality of piezoelectric members, the piezoelectric member 100 may be one or each of the plurality of piezoelectric members. In addition, when the membrane unit 290 is formed as a single membrane member, the membrane member 200 may be the single membrane member, and when the membrane unit 290 includes a plurality of membrane members, the membrane member 200 may be one or each of the plurality of membrane members.

As shown in FIG. 2, the piezoelectric member 100 includes a piezoelectric material 110, and receives an electrical signal from an external driving circuit through electrodes 101 and 102 that are respectively formed at upper and lower surfaces of the piezoelectric material 110. The piezoelectric material 110 may be a conventional piezoelectric material such as lead zirconate titanate (PZT), polyvinylidene difluoride (PVDF), etc. The edge member 400 may be made of an elastic material (e.g., rubber, coated fiber, polyurethane foam, elastomer, silicon, etc.) that shows high elasticity and well absolves unnecessary vibration due to low hardness and low Young's modulus. Gold (Au), silver (Ag), platinum (Pt), aluminum (Al), copper (Cu), etc. may be used as a material of the electrodes 101 and 102, and according to an embodiment, silver powder is melted and applied to upper and lower surfaces of the piezoelectric material 110.

Such piezoelectric member 100 is adhered to the membrane member 200 by an adhesive 201. Any member that has elasticity so as to vibrate by the wave movement of the piezoelectric member 100 may be used as the membrane member 200. When the membrane member 200 is to be used as an electrode, the membrane member 200 may be formed as one or a combination of brass plate, nickel-alloy plate, and stainless steel plate, which show high electrical conductivity. An adhesive typically used for a piezoelectric buzzer may be used as the adhesive 201, and such an adhesive is obvious to a person of ordinary skill in the art.

In such an exemplary embodiment of the present invention, even if the membrane member 200 and the adhesive 201 are not formed with a conductive material, it may be driven by wiring electrodes on the upper and lower sides of the piezoelectric material 110.

When the membrane member 200 is formed with a conductive material, the membrane member 200 may be used as an electrode. In this case, an electrode formed on the surface of the piezoelectric material 110 adhered to the membrane member 200 may partially contact the membrane member 200 such that the piezoelectric material 110 may be electrically connected with the membrane member 200.

In addition, if the adhesive 201 is also formed with a conductive material, the membrane member 200 may be used as an electrode without forming an electrode on the lower surface of piezoelectric material 110 in the drawing. In this case, it is unnecessary to connect a wire through the narrow gap between the piezoelectric member 100 and membrane member 200.

Hereinafter, the principle of generating sound in response to an electrical signal in the actuator element 175 according to an exemplary embodiment of the present invention is described.

Figure 3:
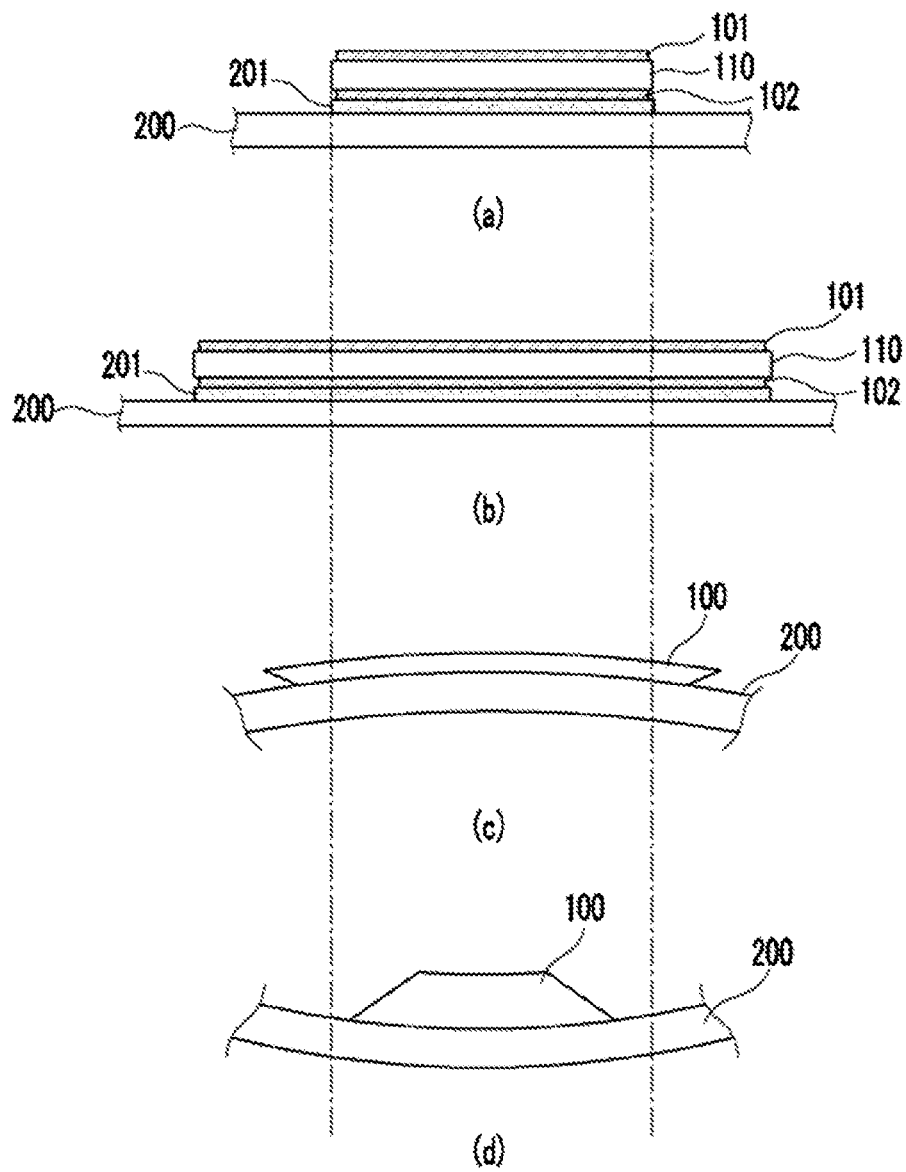
FIG. 3 illustrates an operation of an actuator element according to an exemplary embodiment of the present invention.

FIG. 3 illustrates an operation of the actuator element 175 according to an exemplary embodiment of the present invention.

The actuator element 175 according to an exemplary embodiment of the present invention shows overall bending according to a difference in electric expansion rates of the piezoelectric member 100 and membrane member 200. Here, the electric expansion rate means an amount of shrinkage or expansion of a material caused by application of electricity.

FIG. 3 (a) is a cross-sectional view of the actuator element 175 when electricity is not applied to the first and second electrode 101 and 102. FIG. 3 (b) is a cross-sectional view of the actuator element 175 when electric expansion rates of the piezoelectric member 100 and the membrane member 200 are the same. FIG. 3 (c) and FIG. 3 (d) are cross-sectional views of the actuator element 175 illustrating wave movement of the membrane member 200 caused by application of electricity to the first and second electrodes 101 and 102, when electric expansion rates of the piezoelectric member 100 and the membrane member 200 are different.

When electric expansion rates of the piezoelectric member 100 and the membrane member 200 are the same, wave movement of the piezoelectric member 100 and the membrane member 200 does not occur as shown in FIG. 3 (b), since the membrane member 200 also expands at the same rate while the piezoelectric member 100 expands.

When electric expansion rates of the piezoelectric member 100 and the membrane member 200 are different, i.e., when the electric expansion rate of the membrane member 200 is lower than that of the piezoelectric member 100, the membrane member 200 expands or shrinks at a much lower rate while the piezoelectric member 100 expands or shrinks in response to applied electricity, and accordingly, the membrane member 200 adhered to the piezoelectric member 100 shows a wave movement as shown in FIG. 3 (c) and FIG. 3 (d). Such is similar to a principle of a bi-metal.

As can be understood from the following Equation 1, a resonance frequency $f_{res}$ becomes lower when a thickness t of the membrane unit 290 is smaller and a length L of the membrane unit 290 is larger. In the following Equation 1, $f_{res}$ is a resonance frequency, k is a proportional constant, t is a thickness of the membrane unit 290, L is a length from the supporting member 300 to an end of the membrane unit 290, E is a Young's modulus, ρ is a density of the membrane unit 290, and u is a Poisson's ratio.

$$f_{res} = \frac{k \cdot t}{L^2} \sqrt{\frac{E}{\rho(1-v^2)}}$$  Equation 1

When an electrical sound signal of a relatively low frequency is input to the piezoelectric member 100, the piezoelectric member 100 shows relatively slow shrinkage or expansion, and thus a wave movement of a long wavelength occurs at the piezoelectric member 100 and the membrane member 200 by the shrinkage/expansion of the piezoelectric member 100. That is, a low tone sound of about a resonance frequency (i.e., $1^{st}$ order resonance frequency) of the membrane member 200 may be generated.

When an electrical sound signal of a relatively high frequency is input to the piezoelectric member 100, the piezoelectric member 100 shows relatively rapid shrinkage or expansion, and thus a wave movement of a short wavelength occurs at the piezoelectric member 100 and the membrane member 200 by the shrinkage/expansion of the piezoelectric member 100. That is, a surface vibration is formed at the membrane member 200, and accordingly, a high tone sound (e.g., of $2^{nd}$, $3^{rd}$, or higher order resonance frequency) may be generated.

In the above description with reference to FIG. 1 to FIG. 3, it is exemplarily described that the piezoelectric member 100 is adhered to an upper side of the membrane member 200. It must be understood that the piezoelectric member 100 may be adhered to a lower side of the membrane member 200, and an operation of such an arrangement may be easily understood with reference to the above description.

Referring back to FIG. 8 and FIG. 9, according to an exemplary embodiment of the present invention, the piezoelectric member 100 is not required to be adhered to only a single side (i.e., the upper side in the drawing) of the membrane member 200 (such a scheme is hereinafter called a unimorph type), and may be adhered to both sides of the membrane member 200 (such a scheme is hereinafter called a bimorph type).

Hereinafter, configuration and operation of an exemplary bimorph type actuator element where piezoelectric members 100 and 100' are respectively adhered to upper and lower surfaces of the membrane member 200 are described with reference to FIG. 4 and FIG. 5.

Figure 4:
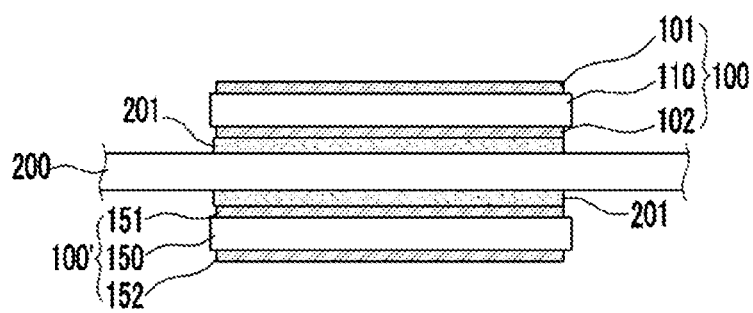
FIG. 4 is a cross-sectional view of an actuator element according to an exemplary embodiment of the present invention, and illustrates that a piezoelectric member is attached to upper and lower surfaces of a membrane member.

FIG. 4 is a cross-sectional view of an actuator element according to an exemplary embodiment of the present invention, and illustrates that piezoelectric members 100 and 100' are attached to upper and lower surfaces of a membrane member 200. FIG. 5 illustrates an operation of an actuator element of FIG. 4 according to an exemplary embodiment of the present invention.

The same as the piezoelectric member 100 adhered to the upper surface of the membrane member 200, the piezoelectric member 100' adhered to the lower surface of the membrane member 200 includes a piezoelectric material 150 and electrodes 151 and 152 respectively formed on upper and lower surfaces of the piezoelectric material 150. The piezoelectric member 100' is adhered to the membrane member 200 by the adhesive 201. The electrodes 151 and 152 may be formed by the same scheme and of the same material as the electrodes 101 and 102.

In such a bimorph type, the piezoelectric members 100 and 100' on the upper and lower sides of the membrane member 200 are arranged such that shrinkage/expansion thereof becomes opposite. It may be obvious to a person of ordinary skill in the art that shrinkage/expansion thereof may become opposite by polarities of the upper and lower piezoelectric members 100 and 100' or by polarities of electricity sources applied to them.

Figure 5:
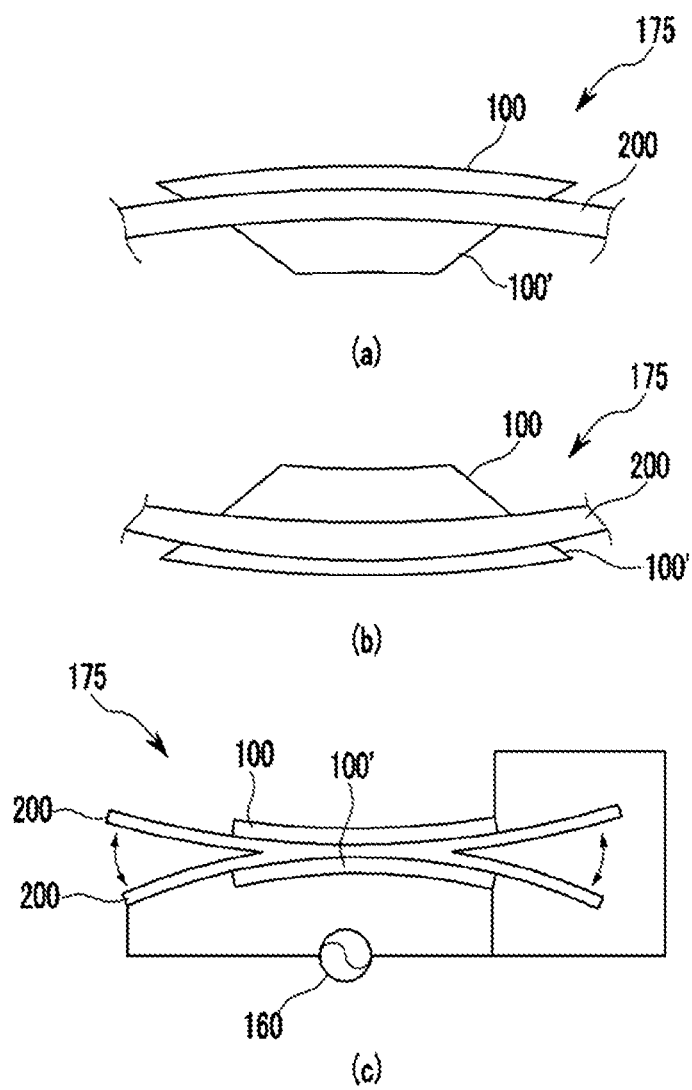
FIG. 5 illustrates an operation of an actuator element of FIG. 4 according to an exemplary embodiment of the present invention.

When electricity of a certain polarity is applied to such an actuator element 175, the upper piezoelectric member 100 of the membrane member 200 expands and the lower piezoelectric member 100' shrinks, as shown in FIG. 5 (a). When electricity of an opposite polarity is applied, the upper piezoelectric member 100 of the membrane member 200 shrinks and the lower piezoelectric member 100' expands, as shown in FIG. 5 (b). When an alternating current (AC) is applied, such an alternating operation is repeated, and thus wave movement occurs at the actuator element 175.

When the membrane member 200 is formed as a conductor and the adhesive 201 is formed of a conductive material, the membrane member 200 may be used as an electrode without employing the electrodes 102 and 152, which is the same as in the case of the piezoelectric member 100 being adhered to only an upper side of the membrane member 200. By adhering the piezoelectric members 100 and 100' to the upper and lower sides of the membrane member 200 with opposite polarities with respect to the membrane member 200, the piezoelectric member 100' may shrink when the piezoelectric member 100 expands, and the piezoelectric member 100' may expand when the piezoelectric member 100 shrinks. In this case, wave movement of the actuator element 175 may be realized as shown in FIG. 5 (c) by applying an electricity source to a circuit.

When the actuator element 175 is formed as a bimorph type, wave movement may be realized by two piezoelectric members 100 and 100', and thus amplitude of the membrane member 200 within the same area may be increased. This means that a sound pressure level may be increased since amplitude of the membrane member 200 (or the driven member 250 adhered thereto) may be converted to a sound pressure level.

The piezoelectric member 100 according to an exemplary embodiment of the present invention is formed such that its length is larger than its width by at least $\sqrt{2}$ times. That is, the piezoelectric member 100 according to an exemplary embodiment of the present invention is formed in a lengthy shape rather than as a square. It may be understood that a large difference in the length and the width enables the piezoelectric member 100 to shrink/expand in a single direction, while direction of shrinkage/expansion may not be determined in the case that the length and the width are similar. That is, it may be understood that the wave movement of the actuator element 175 according to an exemplary embodiment of the present invention occurs in the length direction of the piezoelectric member 100.

Although the piezoelectric member 100 according to an exemplary embodiment of the present invention is illustrated as being rectangular in the drawing, it should be understood that the scope of the present invention is not limited thereto. For example, the piezoelectric member 100 may be elliptical, in which a length of a major axis is larger than a length of a minor axis by at least $\sqrt{2}$ times.

It is described above that, with reference to FIG. 8 and FIG. 9, the membrane unit 290 of an acoustic actuator according to an exemplary embodiment of the present invention includes a driven member 250. Hereinafter, configuration and operation of such an embodiment employing a driven member is described.

Figure 6:
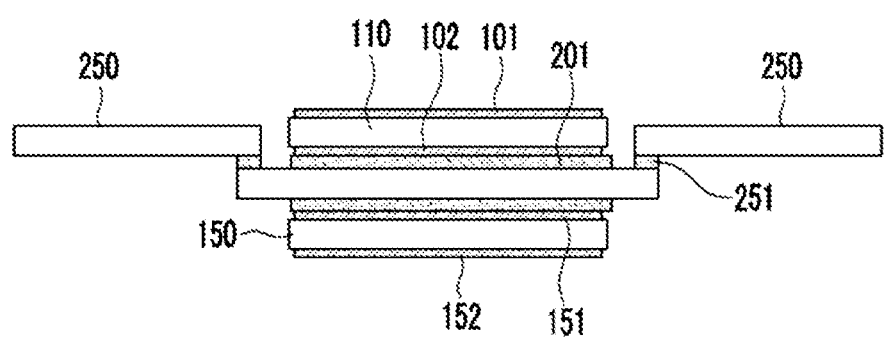
FIG. 6 is a cross-sectional view of an actuator element including a driven member according to an exemplary embodiment of the present invention.

FIG. 6 illustrates a cross-sectional view of an actuator element 175 including a driven member 250.

As shown in FIG. 6, according to an exemplary embodiment of the present invention, the driven member 250 is attached to the membrane member 200 of the membrane unit 290 by an adhesive 251. Therefore, the membrane unit 290 extends in the length direction of the membrane member 200, and wave movement of the membrane member 200 is amplified. Although FIG. 6 illustrates that the driven member 250 is attached to an end of the membrane member 200, it should be understood that the scope of the present invention is not limited thereto. The driven member 250 may be attached to the membrane unit 290 through a relatively large area. In addition, although FIG. 6 illustrates that the driven member 250 is attached to both ends of the membrane unit 290, it should be understood that the scope of the present invention is not limited thereto. A single driven member 250 extending to form ends of the membrane unit 290 may be disposed between the membrane unit 290 and either one of the upper and lower piezoelectric units 190.

The driven member 250 and the adhesive 251 are not necessarily conductive materials, and in this case, an electricity source may be supplied through electrodes of the piezoelectric members 100 and 100' or the membrane member 200.

In such an exemplary embodiment of the present invention, employing the driven member 250 may become very effective when the membrane member 200 is conductive but relatively heavy-weighted like brass plate, nickel-alloy plate, white bronze, phosphor bronze, and stainless steel (more precisely, when resonance frequency of the membrane member 200 is high due to a material characteristic). That is, by using the driven member 250 having a lower resonance frequency in comparison with the membrane member 200, an overall resonance frequency of the actuator element 175 may be lowered, and thereby a low tone sound may be better realized. Materials and dimensions of the driven member 250 may be obviously determined by a person of ordinary skill in the art considering a desired resonance frequency, for example, by varying a thickness and/or a length thereof. For example, in an exemplary embodiment of the present invention, the driven member 250 may be formed of at least one material of aluminum, beryllium, magnesium, titanium, pulp, and a polymer material.

Figure 7:
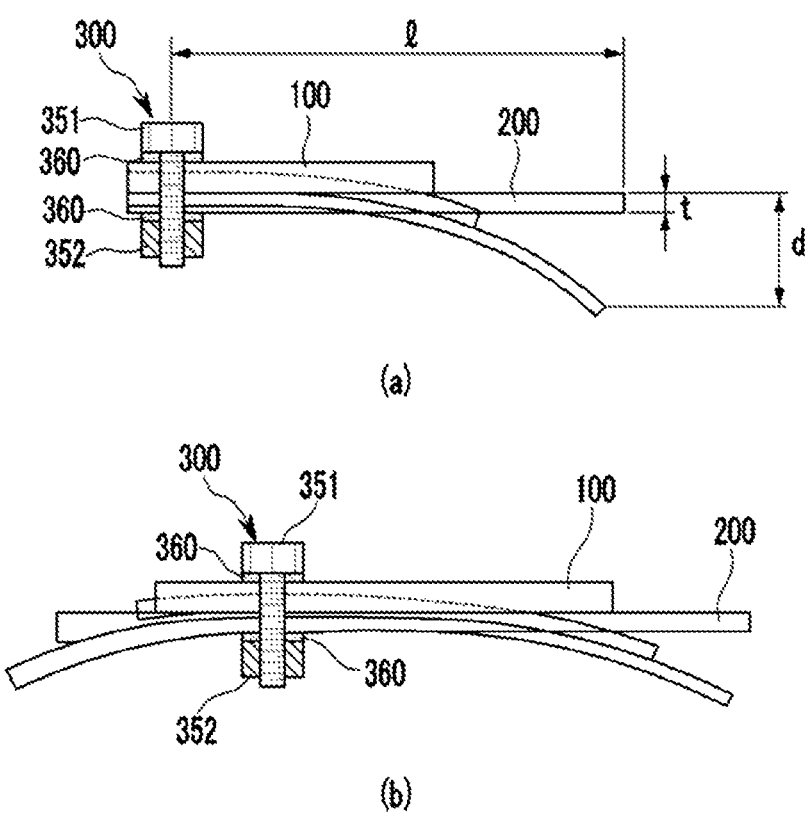
FIG. 7 is a cross-sectional view illustrating operation of single and double cantilever type actuator elements according to an exemplary embodiment of the present invention.

Referring back to FIG. 8 and FIG. 9, an acoustic actuator according to an exemplary embodiment of the present invention may be realized as a single cantilever type (refer to FIG. 8) or a double cantilever type (refer to FIG. 9). Hereinafter, operations of embodiments of a single cantilever type and a double cantilever type are described in detail with reference to FIG. 7 (a) and FIG. 7 (b). FIG. 7 illustrates a bolt 351 and a nut 352 as an example of the supporting member 300.

FIG. 7 (a) illustrates a single cantilever where the actuator element 175 is formed in a single direction with regard to the bolt 351 and the nut 352 as the supporting member 300, and FIG. 7(b) illustrates a double cantilever where the actuator element 175 is formed in both directions with regard to the bolt 351 and the nut 352 as the supporting member 300.

Equation 1 is equally applicable to both of the single cantilever and double cantilever types according to an exemplary embodiment of the present invention. That is, resonance frequency is relative to length and thickness of the membrane unit 290.

The following Equation 2 may be referred to for determining amplitude of the membrane member 200. In Equation 2, $\delta_{max}$ is a maximum amplitude at an end of the membrane unit 290, P is a bending strength of the piezoelectric member 100, E is a Young's modulus, w is a width of the membrane member 200, L is a length of the membrane unit 290, and t is a thickness of the membrane unit 290.

$$\delta_{max} \propto \frac{P \cdot L^3}{E \cdot w \cdot t^3} \qquad \text{Equation 2}$$

It will be understood that, when the piezoelectric member 100 is asymmetrically formed with respect to the supporting member 300, resonance frequency and amplitude of the piezoelectric unit 190 are different at the left and right sides with respect to the supporting member 300.

Therefore, as shown in FIG. 7 (b), in a double cantilever type actuator element 175 according to an exemplary embodiment of the present invention, the piezoelectric member 100 and the membrane member 200 may be formed at respective sides of the double cantilever with different lengths and thicknesses. In this case, different resonance frequencies and different amplitudes are achieved at respective sides of the supporting member 300. Thereby, according to such an asymmetrical actuator element 175, flatness over a frequency bandwidth may be improved.

For example, if the $1^{st}$ order resonance frequency of the actuator element shown in FIG. 7 (b) is formed low at the right portion with respect to the supporting member 300, this right portion may have a low sound pressure level for high frequency. This is because, although resonance frequencies of $2^{nd}$, $3^{rd}$, and higher order are also formed at the right portion, strength of the resonance steeply decreases as the order or resonance increases. Therefore, a high frequency sound pressure level may be compensated by forming the resonance frequency of the left portion higher than that of the right portion, e.g., by shortening or thickening the left portion of the supporting member 300, and thereby an overall sound pressure level over the left and right portions may show an improvement in flatness in a wider frequency bandwidth.

Referring back to FIG. 8 and FIG. 9, although they illustrate that the piezoelectric unit 190 according to an exemplary embodiment of the present invention includes a plurality of piezoelectric members 100 and the membrane unit 290 according to an exemplary embodiment of the present invention includes a plurality of membrane members 200, it should be understood that the scope of the present invention is not limited thereto. Depending on embodiments, the piezoelectric unit 190 may be formed as a single piezoelectric member 100, and the membrane unit 290 may be formed as a single membrane member 200.

In addition, FIG. 8 and FIG. 9 illustrate that the membrane unit 290 according to an exemplary embodiment of the present invention includes the driven member 250. However, it should be understood that the scope of the present invention is not limited thereto. Depending on an embodiment, the driven member 250 may not be employed.

Figure 10:
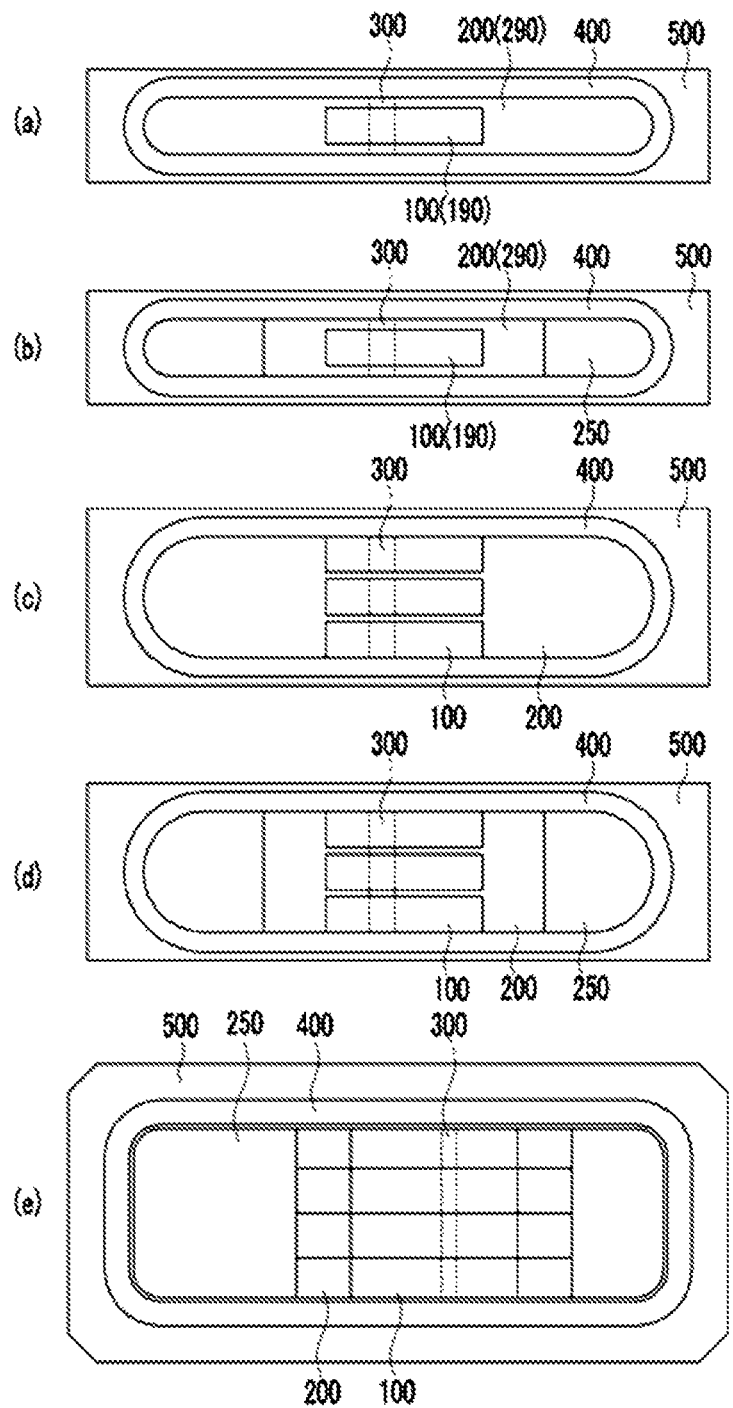
FIG. 10 illustrates various exemplary variations with respect to the number of piezoelectric members, the number of membrane members, and/or employing a driven member or not.

FIG. 10 is a top plan view illustrating such various exemplary variations.

FIG. 10 (a) illustrates that the piezoelectric unit 190 is formed as a single piezoelectric member 100, and the membrane unit 290 is formed as a single membrane member 200 without employing the driven member 250.

FIG. 10 (b) illustrates that the piezoelectric unit 190 is formed as a single piezoelectric member 100, and the membrane unit 290 is formed as a single membrane member 200 to an end of which the driven member 250 is attached.

FIG. 10 (c) illustrates that the piezoelectric unit 190 includes a plurality of piezoelectric members 100, and the membrane unit 290 is formed as a single membrane member 200 without employing the driven member 250. That is, a plurality of piezoelectric members 100 are disposed in parallel (i.e., in a width direction) on the same plane of a single membrane member 200.

FIG. 10 (d) illustrates that the piezoelectric unit 190 includes a plurality of piezoelectric members 100, and the membrane unit 290 is formed as a single membrane member 200 to an end of which the driven member 250 is attached.

FIG. 10 (e) illustrates that the piezoelectric unit 190 includes a plurality of piezoelectric members 100, and the membrane unit 290 includes a plurality of membrane members 200 ends of which are interconnected by being attached by the driven member 250. In this case, the same number of piezoelectric members 100 and membrane members 200 are employed, and the piezoelectric members 100 are respectively adhered to the membrane members 200. Under these conditions, the driven member 250 interconnects ends of the membrane members 200.

Various advantages may be obtained by the feature of the piezoelectric unit 190 including a plurality of piezoelectric members 100.

First of all, when a piezoelectric member 100 is adhered to the membrane member 200 of a same width and length, the length/width ratio of the employed piezoelectric members 100 may be increased by using a plurality of piezoelectric members 100 in parallel in comparison with using a single piezoelectric member 100. This means that bending of the piezoelectric member 100 in its width direction thereof becomes further negligible, and accordingly, wave movement may be further sharply achieved in its length direction.

Furthermore, acoustic actuators of various dimensions may be conveniently manufactured. By increasing the width of the membrane unit 290, a sound pressure level may be increased without affecting the frequency characteristic. That is, in order to produce acoustic actuators of various different sound pressure levels having the same frequency characteristic, membrane units of various widths may be used. In this case, if a single piezoelectric member is used for an acoustic actuator, piezoelectric members of various widths should be prepared according to the widths of the membrane units. However, if a plurality of piezoelectric members are used for an acoustic actuator, a plurality of same piezoelectric members may be arranged in parallel in their width direction in order to cover membrane units of various widths. This means that piezoelectric members of as many different widths as the membrane units are not required to be manufactured, and manufacturing piezoelectric members of merely several basic dimensions suffices, which results in reduction of overall production cost for acoustic actuators of various dimensions.

In the case that the width of the membrane member becomes larger than the length thereof in order to increase the sound pressure level, when a single piezoelectric member is used, length of the employed piezoelectric member may possibly be smaller than $\sqrt{2}$ times its width, or more problematically, the employed piezoelectric member may become lengthy along the width direction of the membrane member. In this case, operation in accordance with the present invention may not be expected. However, when a plurality of piezoelectric members are used, an acoustic actuator in accordance with the present invention may be manufactured by merely using a greater number of piezoelectric members, however wide the membrane member becomes.

Referring back to FIG. 8 and FIG. 9, although the supporting member 300 is illustrated as a single member formed along the width direction of the actuator element 175, it should be understood that the scope of the present invention is not limited thereto. Various variations may be employed thereto. Hereinafter, various exemplary variations of the supporting member 300 and various exemplary variations in their coupling with the actuator element 175 are described in detail with reference to FIG. 11 to FIG. 13.

Figure 11:
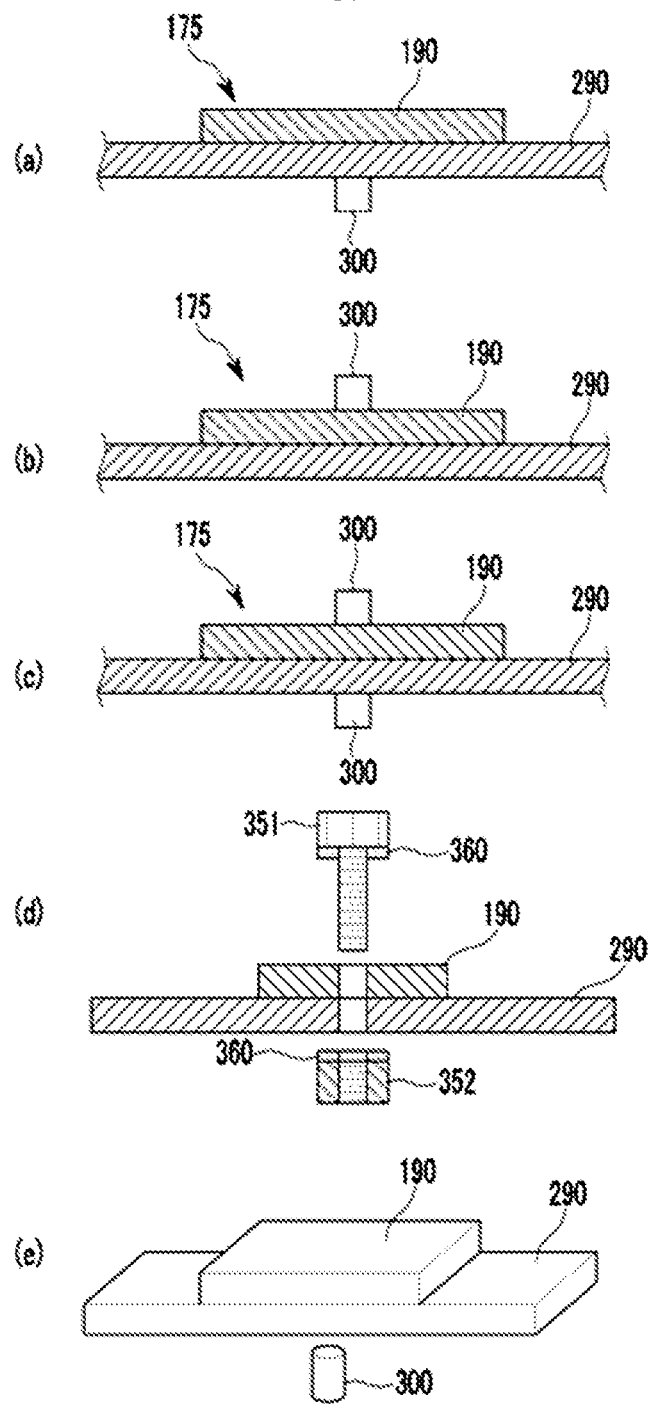
FIG. 11 illustrates various exemplary variations of a supporting member according to an exemplary embodiment of the present invention.

FIG. 11 illustrates various exemplary variations of the supporting member 300.

As shown in FIG. 8 and FIG. 9, the supporting member 300 may be formed as a single member arranged along the width direction of the actuator element 175. As shown in FIG. 11 (a), the supporting member 300 may be coupled with the actuator element 175 from below. In addition, as shown in FIG. 11 (b), the supporting member 300 may be coupled with the actuator element 175 from above. Furthermore, as shown in FIG. 11 (c), the supporting member 300 may be formed at and coupled respectively with upper and lower sides of the actuator element 175.

In addition, the supporting member 300 may be a member having a shape of a plate or a sheet as shown in FIG. 8 and FIG. 9, or may include the bolt 351 and the nut 352 as shown in FIG. 11 (d). The supporting member 300 formed as a bolt and a nut is also described above with reference with FIG. 7 (a) and FIG. 7 (b).

The supporting member 300 does not necessarily support the actuator element 175 linearly, and it may support a point of the actuator element 175 as shown in FIG. 11 (e).

Figure 12:
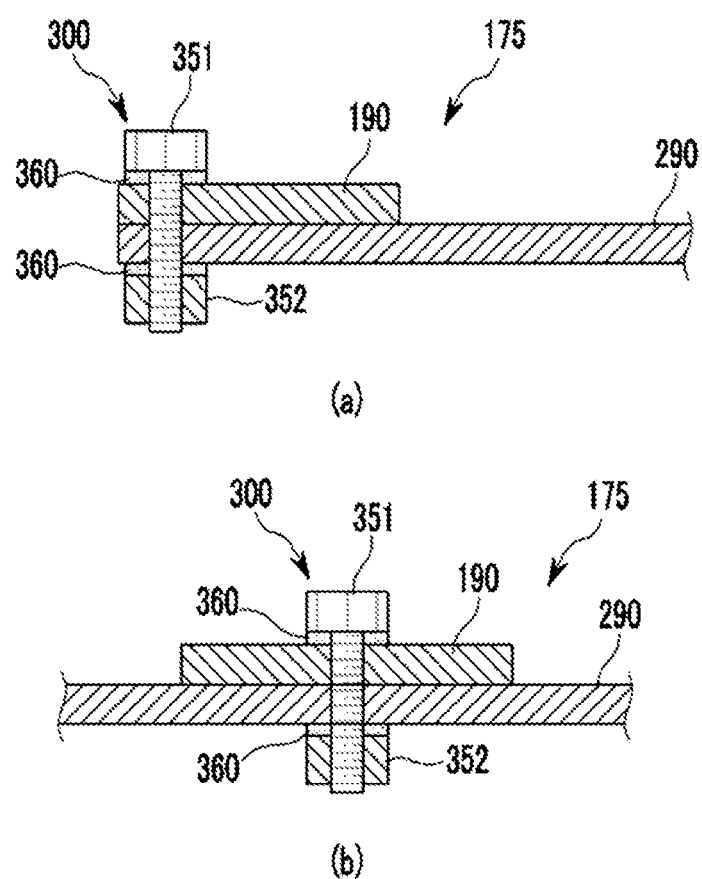
FIG. 12 and FIG. 13 illustrate various exemplary variations in coupling of a supporting member and an actuator element.
Figure 13:
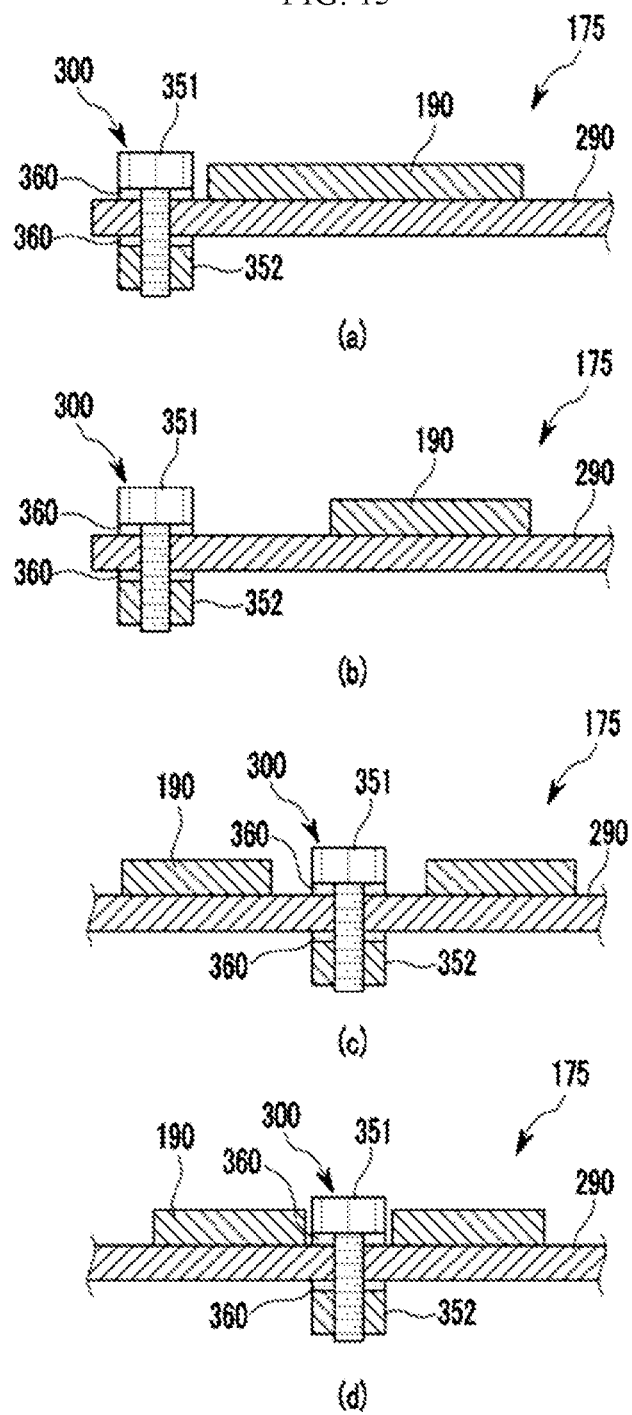

FIG. 12 and FIG. 13 illustrate various exemplary variations in coupling of the supporting member 300 and the actuator element 175, taking the bolt 351 and the nut 352 as an example of the supporting member 300.

FIG. 12 illustrates that the bolt 351 and the nut 352 as the supporting member 300 are engaged with both the piezoelectric unit 190 and the membrane unit 290 of the actuator element 175. FIG. 12 (*a*) illustrates a single cantilever type acoustic actuator where the supporting member 300 is coupled with an end the piezoelectric unit 190, and FIG. 12 (*b*) illustrates a double cantilever type acoustic actuator where the supporting member 300 is coupled with the piezoelectric unit 190 at its interior location.

FIG. 13 illustrates that the bolt 351 and the nut 352 as the supporting member 300 are only engaged with the membrane unit 290 of the actuator element 175.

FIG. 13 (*a*) illustrates that the piezoelectric unit 190 is formed close to the supporting member 300 at a single side. FIG. 13 (*b*) illustrates that the piezoelectric unit 190 is formed distal to the supporting member 300 at a single side.

FIG. 13 (*c*) illustrates that the piezoelectric unit 190 is formed close to the supporting member 300 at both sides. FIG. 13 (*d*) illustrates that the piezoelectric unit 190 is formed distal to the supporting member 300 at both sides.

That is, although it is illustrated in FIG. 8 to FIG. 10 and described with reference thereto that a single piezoelectric unit 190 is adhered to the actuator element 175 along its length direction, it should be understood that the scope of the present invention is not limited thereto. The actuator unit 175 according to an exemplary embodiment of the present invention may include a plurality of piezoelectric units 190 arranged in a length direction, and the supporting member 300 may be coupled with the membrane unit 290 between the piezoelectric units 190.

As a variation in coupling of the supporting member 300 and the actuator element 175, the supporting member 300 may directly contact the actuator element 175, or as shown in FIG. 12 and FIG. 13, an elastic member 360 may be interposed between the supporting member 300 and the actuator element 175.

For example, when only a low frequency sound is required, the supporting member 300 may be tightly coupled by using a threaded fastener or a high strength adhesive in order to suppress surface vibration, since surface vibration is not intensively required for low frequency sound.

When high frequency sound is substantively required, the elastic member 360 formed of rubber, coated fiber, polyurethane foam, elastomer, silicon, etc. may be inserted between the supporting member 300 and the piezoelectric member 100 since surface vibration is intensively required. In the case of the supporting member 300 coupling by adhesion and not by threaded engagement, a flexible adhesive may be used as the elastic member 360.

Hereinafter, an operation of an acoustic actuator according to an exemplary embodiment of the present invention is described in detail with reference to FIG. 14.

Figure 14:
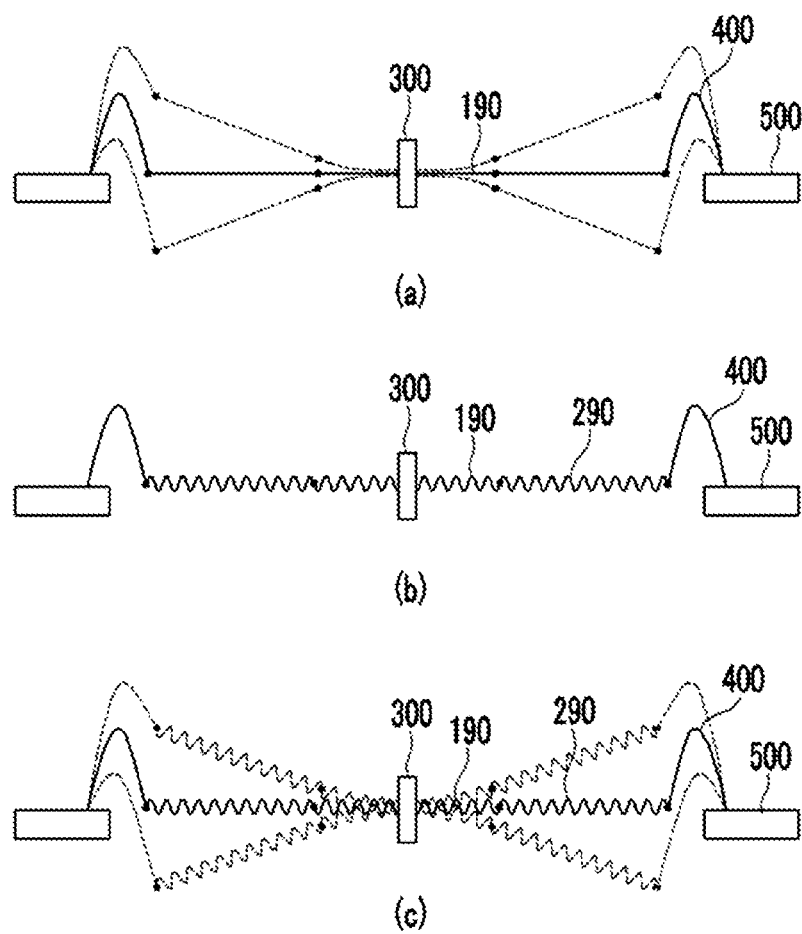
FIG. 14 is a cross-sectional view showing an operation of an acoustic actuator according to an exemplary embodiment of the present invention.

FIG. 14 is a cross-sectional view showing an operation of an acoustic actuator according to an exemplary embodiment of the present invention.

At a low frequency, as shown in FIG. 14 (*a*), overall bending at the membrane unit 290 occurs by repetition of shrinkage and expansion of the piezoelectric unit 190.

Although it is illustrated in the drawing that the portion of the membrane unit 290 linearly extends from the piezoelectric unit 190 during alternation of overall bending, it should be understood that the illustration is made for extremely low frequency i.e., a frequency near to direct current (DC), for convenience of comprehension. At an alternating current (AC) of about a resonance frequency of the membrane unit 290 where the acoustic actuator generates a normal sound, vibration of the membrane unit 290 becomes highly activated with much larger amplitude in comparison with overall bending of the piezoelectric unit 190, and this vibration forms wave movement of the membrane unit 290.

When a signal of a higher frequency that is highly above the resonance frequency of the membrane unit 290 is applied, surface vibration occurs in the membrane unit 290 as shown in FIG. 14 (*b*), and thereby, a high frequency sound is generated.

Therefore, when a synthetic signal of various frequencies over a wide frequency bandwidth from a low frequency of about the resonance frequency of the membrane unit 290 to a higher frequency is applied, wave movement as a combination of overall bending and surface vibration occurs at the membrane unit 290 as shown in FIG. 14 (*c*), and thereby, the acoustic actuator simultaneously generates a low frequency sound and a high frequency sound.

Although FIG. 14 (*b*) and FIG. 14 (*c*) illustrate that the membrane unit 290 vibrates according to a sine wave having a sine frequency and amplitude, it must be understood that such illustration is for convenience of comprehension, and it is obvious to a person of ordinary skill in the art that the membrane unit 290 may vibrate at various frequencies and amplitudes at the same time in response to an applied signal.

According to an actuator element according to an exemplary embodiment of the present invention, wave movement is formed in its length direction rather than its width direction by forming the piezoelectric member 100 such that its length is larger than its width by at least $\sqrt{2}$ times. In addition, a membrane member is fixedly adhered to the piezoelectric member such that the membrane unit may extend in the length direction of the piezoelectric member. Such an actuator element according to an exemplary embodiment of the present invention is formed in a generally linear shape in comparison with a conventional piezoelectric speaker that is formed in a generally circular shape.

When electricity of a certain polarity is applied to the actuator element 175, overall bending occurs as described above, and when electricity of an opposite polarity is applied, overall bending occurs in an opposite direction. Such overall bending is repeated, and thereby wave movement is formed.

Hereinafter, in comparison with a conventional piezoelectric speaker that is formed in a circular shape, it will be described that a linear the actuator element 175 according to an exemplary embodiment of the present invention shows a very low resonance frequency, and thus may realize a sufficiently low frequency bandwidth with a very small size.

Figure 18:
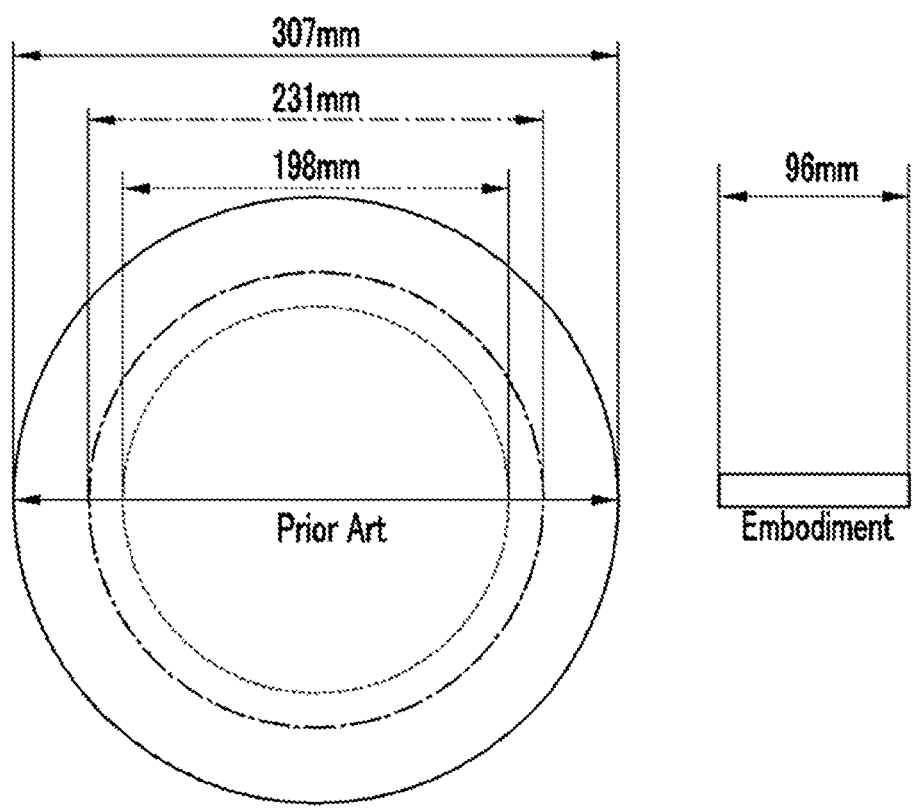
FIG. 18 illustrates required sizes of a thin plate and a single cantilever for generating 20 Hz sound.

The resonance frequency realized by a conventional circular piezoelectric buzzer is summarized as shown in FIG. 18. In contrast with a conventional circular piezoelectric buzzer, the resonance frequency of an actuator element according to an exemplary embodiment of the present invention may be calculated as shown in FIG. 19.

Referring to the resonance frequency and resonance constant shown in FIG. 19, a required size of a thin plate and a single cantilever for generating a 20 Hz sound is shown in FIG. 18. That is, in order to produce a sound of 20 Hz, a diameter of a piezoelectric buzzer should be as large as 307 mm in a node support scheme, 231 mm in an edge support scheme, and 198 mm in a central support scheme. However, a single cantilever type actuator element according to an exemplary embodiment of the present invention may produce a sound of 20 Hz with a length of a mere 96 mm. It is notable that, in comparison with a circular piezoelectric speaker, the size of an actuator element is very small since it is generally in a linear shape, and its overall length is less than a radius of the piezoelectric buzzer.

Furthermore, when the membrane member 200 extends from the piezoelectric member 100 in its length direction, it is clear that only a portion (i.e., the extension portion) of the membrane member must vibrate more sensitively in comparison with the portion where the piezoelectric member is adhered to the membrane member 200. This means that, when an AC is applied, the extension portion vibrates with a larger amplitude than the piezoelectric member portion. Consequently, vibration may become stronger and the sound pressure level may be improved by adhering the piezoelectric member to the membrane member by a partial length, rather than by an entire length.

In the above description, a single acoustic actuator and its operation according to an exemplary embodiment of the present invention have been described in detail. It is notable that a sound of a wider frequency range may be generated when more than one such acoustic actuator is employed. Hereinafter, an acoustic actuator system employing a plurality of acoustic actuators according to an exemplary embodiment of the present invention will be described in detail with reference to FIG. 15 and FIG. 16.

Figure 15:
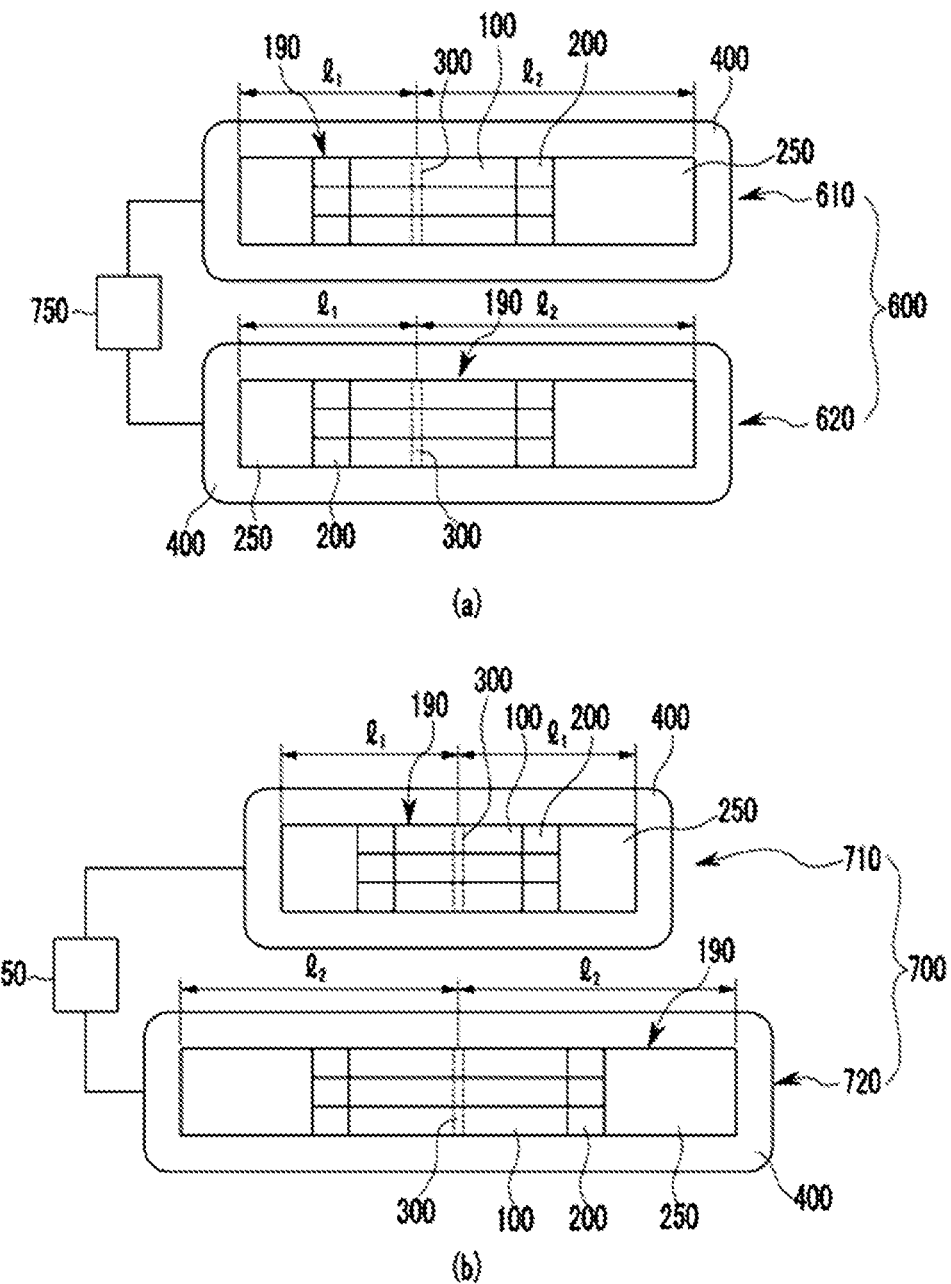
FIG. 15 and FIG. 16 are top plan views showing various combinations of first and second acoustic actuators in an acoustic actuator system according to an exemplary embodiment of the present invention system.
Figure 16:
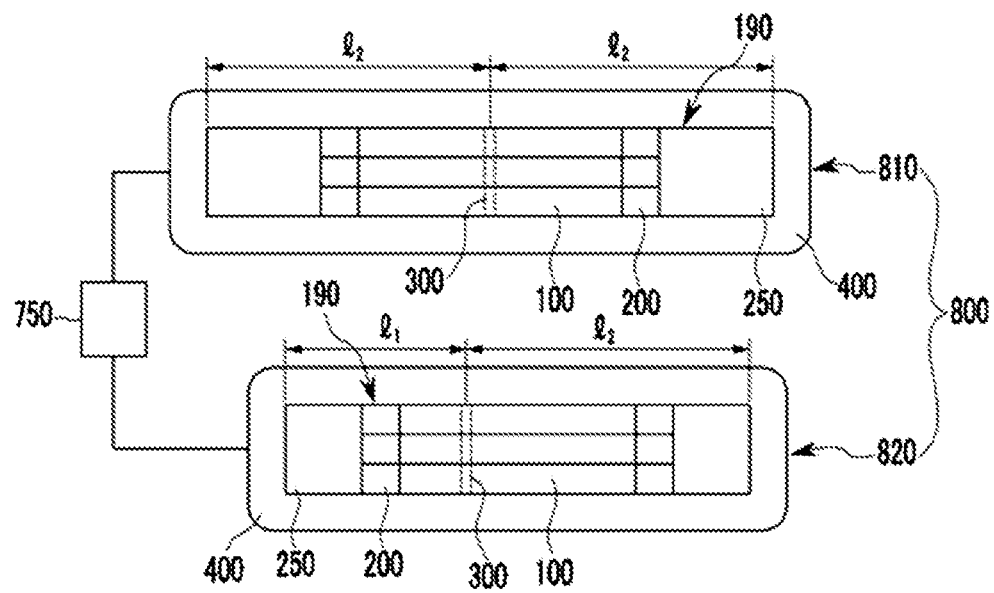
Figure 16:
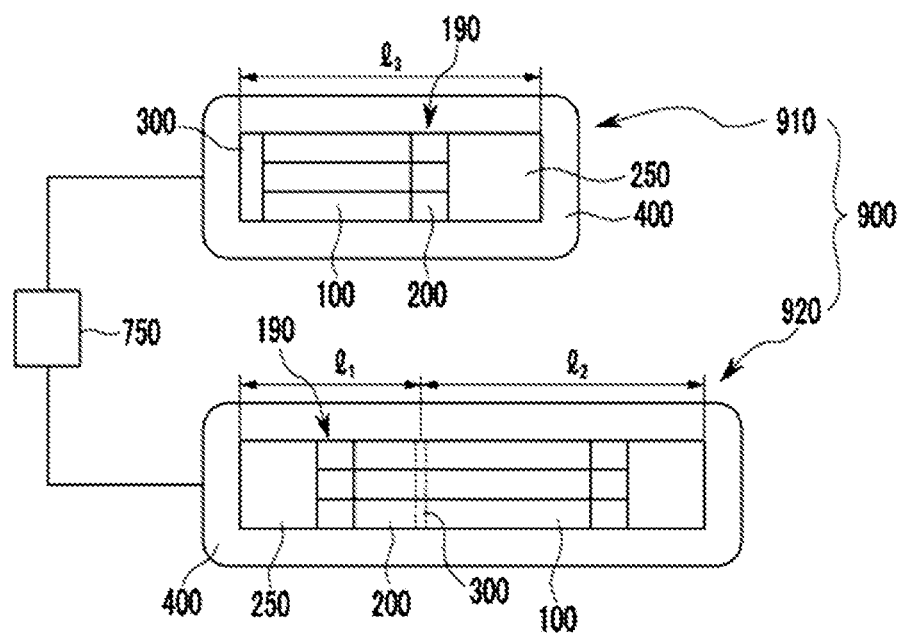
Figure 17:
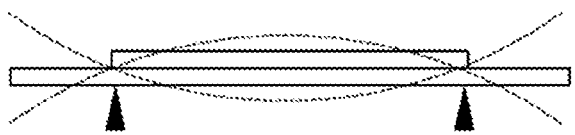
FIG. 17 illustrates resonance frequencies realized by conventional circular piezoelectric buzzers.
Figure 17:
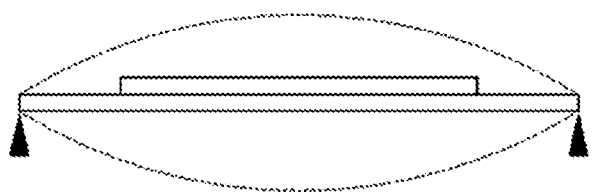
Figure 17:
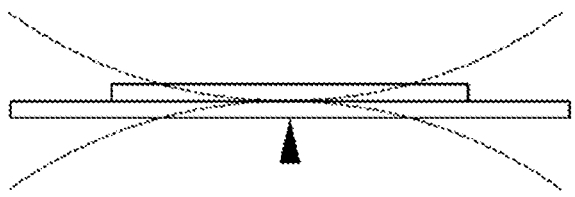

FIG. 15 and FIG. 16 are top plan views showing various combinations of first acoustic actuators 610, 710, 810, and 910 and second acoustic actuators 620, 720, 820, and 920 in an acoustic actuator system according to an exemplary embodiment of the present invention system.

FIG. 15 (a) illustrates an acoustic actuator system 600 in which the first and second acoustic actuators 610 and 620 are formed with the same dimensions, and the first and second acoustic actuators 610 and 620 are asymmetric with respect to the supporting member 300. That is, in each of the acoustic actuators 610 and 620, lengths of the actuator element 175 from the supporting member 300 are differently formed, i.e., as $l_1$ and $l_2$. In addition, as shown in the drawing, respective piezoelectric members 190 of the acoustic actuators 610 and 620 may also be asymmetrically formed with respect to the supporting member 300. According to such an embodiment, the acoustic actuators 610 and 620 are formed as asymmetrical double cantilevers, and thus a plurality of resonance frequencies may be achieved. In addition, the two acoustic actuators 610 and 620 are formed with the same dimensions, and thus the sound pressure levels thereof become the same. Therefore, the sound pressure level is doubled by the acoustic actuators 610 and 620 in comparison with the case using only one of the acoustic actuators 610 and 620.

FIG. 15 (a) illustrates that the first and second acoustic actuators 610 and 620 are formed with the same dimensions as an exemplary case of an acoustic actuator where the first and second acoustic actuators 610 and 620 are asymmetric with respect to the supporting member 300. However, it should be understood that the scope of the present invention is not limited thereto. The first and second acoustic actuators 610 and 620 may be formed with different dimensions, and in this case, further more resonance frequencies may be achieved, thereby further improving the flatness.

FIG. 15 (b) illustrates an acoustic actuator system 700 in which the first and second acoustic actuators 710 and 720 are formed with different dimensions, and the first and second acoustic actuators 610 and 620 are symmetric with respect to the supporting member 300. Since the acoustic actuators 710 and 720 are symmetrically formed with respect to the supporting member 300, the sound pressure level is doubled with the same frequency characteristic at both sides of each of the acoustic actuators 710 and 720 in comparison with the case where the acoustic actuators 710 and 720 are asymmetrically formed. In addition, since the two acoustic actuators 710 and 720 are formed with different dimensions and thus the frequency characteristics of the acoustic actuators 710 and 720 become different to each other, a plurality of resonance frequencies may be achieved. Such an embodiment according to FIG. 15 (b) may, depending on its dimensions, show the same acoustic characteristics as the acoustic actuator shown in FIG. 15 (a). For such a purpose, as shown in FIG. 15 (b), one acoustic actuator 710 may be formed with the same length $l_2$ as the left portions of the acoustic actuators 610 and 620 according to FIG. 15 (a), and the other acoustic actuator 720 may be formed with the same length $l_2$ as the right portions of the acoustic actuators 610 and 620 according to FIG. 15 (a).

FIG. 16 (a) illustrates an acoustic actuator system 800 in which the first and second acoustic actuators 810 and 820 are formed with different dimensions, the first acoustic actuator 810 is symmetric with respect to the supporting member 300, and the second acoustic actuator 820 is asymmetric with respect to the supporting member 300. According to such an acoustic actuator system 800, flatness of sound frequency may be further improved in comparison with the actuator systems 600 and 700 of FIG. 15 (a) and FIG. 15 (b), since further more resonance frequencies may be realized. In addition, the sound pressure level may be doubled for a certain resonance frequency when one acoustic actuator 810 of the two acoustic actuators 810 and 820 is formed symmetric with respect to the supporting member 300. That is, when acoustic efficiency is found to be low at a certain frequency by operation characteristics due to materials and/or dimensions of the piezoelectric member, the membrane member, the driven member, etc., the sound pressure level at such frequency may be increased. In FIG. 16 (a), it is illustrated that the symmetrical length $l_2$ of the first acoustic actuator 810 is equal to the asymmetrical length of the second acoustic actuator 820 from the supporting member 300 in one direction. By such a configuration, the sound pressure level at a certain frequency may be highly increased.

FIG. 16 (b) illustrates an acoustic actuator system 900 in which the first and second acoustic actuators 910 and 920 are formed with different dimensions, the first acoustic actuator 910 is a single cantilever type acoustic actuator, and the second acoustic actuator 920 is a double cantilever type acoustic actuator. According to such an embodiment, a low frequency level available by an acoustic actuator system may be lowered in comparison with an acoustic actuator system having only double cantilever type acoustic actuators, since a single cantilever type acoustic actuator having a low resonance frequency is employed.

Each of the first and second acoustic actuator combinations 610 and 620, 710 and 720, 810 and 820, and 910 and 920 may be connected with and driven by a common piezoelectric unit driver 750, and thereby generates sounds.

| <Description of Symbols> | |
|---|---|
| 100: piezoelectric member | 101: first electrode |
| 102: second electrode | 110: piezoelectric material |
| 150: auxiliary piezoelectric member | 151: third electrode |
| 152: fourth electrode | 160: electricity source |
| 175: actuator element | 190: piezoelectric unit |
| 200: membrane member | 201, 251: adhesive |
| 250: driven member | 290: membrane unit |
| 300: supporting member | 351: bolt |
| 352: nut | 360: elastic member |
| 400: edge member | 500: frame |
| 600: acoustic actuator system | 610: first acoustic actuator |

-continued

<Description of Symbols>

| | |
|---|---|
| 620: second acoustic actuator | 700: acoustic actuator system |
| 710: first acoustic actuator | 720: second acoustic actuator |
| 750: piezoelectric unit driver | 800: acoustic actuator system |
| 810: first acoustic actuator | 820: second acoustic actuator |
| 900: acoustic actuator system | 910: first acoustic actuator |
| 920: second acoustic actuator | |

The invention claimed is:

1. An acoustic actuator comprising:
an actuator element configured to generate a corresponding sound in response to an applied electrical signal;
a supporting member supporting the actuator element so as to form a movement axis of the actuator element; and
an edge member connected with the actuator element,
wherein the actuator element comprises:
a piezoelectric unit having at least one piezoelectric member of which a length is larger than a width by at least $\sqrt{2}$ times; and
a membrane unit including at least one membrane member configured to generate the corresponding sound in response to the applied electrical signal, by being fixedly surface-adhered to the piezoelectric unit so as to extend in a length direction of the at least one piezoelectric member and by forming wave movement in the adhered surface in the length direction in response to a current applied to the piezoelectric unit.

2. The acoustic actuator of claim 1, wherein the piezoelectric unit comprises a plurality of piezoelectric members disposed in parallel in their width direction on a same plane.

3. The acoustic actuator of claim 1, wherein the membrane unit further comprises a driven member configured to amplify the wave movement of the membrane member by being adhered to the membrane member such that the membrane unit extends in a length direction of the membrane member.

4. The acoustic actuator of claim 2, wherein the membrane unit further comprises a driven member configured to amplify the wave movement of the membrane member by being adhered to the membrane member such that the membrane unit extends in a length direction of the membrane member.

5. The acoustic actuator of claim 1, wherein the supporting member is formed at a location that asymmetrically divides the actuator element.

6. The acoustic actuator of claim 1, wherein:
the supporting member is coupled with the membrane unit; and
the piezoelectric unit is spaced apart from the supporting member along the length direction of the at least one piezoelectric member.

7. The acoustic actuator of claim 5, wherein:
the supporting member is coupled with the membrane unit; and
the piezoelectric unit is formed distal to the supporting member along a length direction of the piezoelectric unit.

8. The acoustic actuator of claim 2, wherein:
the membrane unit comprises a same number of membrane members as the plurality of piezoelectric members; and
the piezoelectric members are respectively adhered to the membrane members.

9. The acoustic actuator of claim 8, wherein the membrane unit further comprises a driven member configured to amplify the wave movement of the plurality of membrane members by interconnecting ends of the plurality of membrane members such that the membrane unit extends in a length direction of the plurality of membrane members.

10. The acoustic actuator of claim 1, wherein the piezoelectric unit is adhered to upper and lower sides of the membrane unit.

11. The acoustic actuator of claim 1, further comprising an elastic member interposed between the actuator element and the supporting member so as to allow surface vibration of the actuator element.

12. An acoustic actuator system comprising:
a first acoustic actuator according to claim 1;
a second acoustic actuator according to claim 1; and
a piezoelectric unit driver that drives the first and second acoustic actuators at the same time.

13. The acoustic actuator system of claim 12, wherein each of the first and second acoustic actuators is asymmetrical with respect to the respective supporting members.

14. The acoustic actuator system of claim 12, wherein:
the first acoustic actuator and the second acoustic actuator have different dimensions; and
each of the first and second acoustic actuators is symmetrical with respect to the respective supporting members.

15. The acoustic actuator system of claim 12, wherein:
the first acoustic actuator and the second acoustic actuator have different dimensions;
the first acoustic actuator is symmetrical with respect to its supporting member; and
the second acoustic actuator is asymmetrical with respect to its supporting member.

16. The acoustic actuator system of claim 12, wherein:
the first acoustic actuator is a single cantilever type; and
the second acoustic actuator is a double cantilever type.

* * * * *